(12) United States Patent
Sadaka et al.

(10) Patent No.: US 7,575,968 B2
(45) Date of Patent: Aug. 18, 2009

(54) INVERSE SLOPE ISOLATION AND DUAL SURFACE ORIENTATION INTEGRATION

(75) Inventors: Mariam G. Sadaka, Austin, TX (US); Debby Eades, Manor, TX (US); Joe Mogab, Austin, TX (US); Bich-Yen Nguyen, Austin, TX (US); Melissa O. Zavala, Pflugerville, TX (US); Gregory S. Spencer, Pflugerville, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 1 day.

(21) Appl. No.: 11/742,081

(22) Filed: Apr. 30, 2007

(65) Prior Publication Data

US 2008/0268587 A1    Oct. 30, 2008

(51) Int. Cl.
*H01L 21/8238* (2006.01)
(52) U.S. Cl. ............... 438/199; 438/429; 438/701; 257/E21.632; 257/E21.548
(58) Field of Classification Search ............. 438/199, 438/429, 481, 701; 257/E21.546, E21.548, 257/E21.632
See application file for complete search history.

(56) References Cited

U.S. PATENT DOCUMENTS

| | | | | |
|---|---|---|---|---|
| 6,362,071 | B1 | 3/2002 | Nguyen et al. | 438/416 |
| 6,902,962 | B2* | 6/2005 | Yeo et al. | 438/150 |
| 6,972,478 | B1* | 12/2005 | Waite et al. | 257/627 |
| 7,144,779 | B2* | 12/2006 | Ramaswamy et al. | 438/269 |
| 7,186,622 | B2* | 3/2007 | Yan et al. | 438/296 |
| 7,208,815 | B2* | 4/2007 | Chen et al. | 257/627 |
| 7,298,009 | B2* | 11/2007 | Yan et al. | 257/357 |
| 7,368,334 | B2* | 5/2008 | Yeo et al. | 438/150 |
| 7,432,149 | B2* | 10/2008 | Wu et al. | 438/222 |
| 7,435,639 | B2* | 10/2008 | Winstead et al. | 438/199 |
| 2005/0116290 | A1 | 6/2005 | de Souza et al. | 257/347 |

OTHER PUBLICATIONS

C.Y. Sung et al., "High Performance CMOS Bulk Technology Using Direct Silicon Bond (DSB) Mixed Crystal Orientation Substrates," IEEE 2005.
M. Yang et al., "On the Integration of CMOS with Hybrid Crystal Orientations," 2004 Symposium on VLSI Technology Digest of Technical Papers.
M. Yang et al., "High Performance CMOS Fabricated on Hybrid Substrate with Different Crystal Orientations," IEEE 2003.

\* cited by examiner

*Primary Examiner*—Charles D. Garber
*Assistant Examiner*—Stanetta D Isaac
(74) *Attorney, Agent, or Firm*—Hamilton & Terrile, LLP; Michael Rocco Cannatti

(57) ABSTRACT

A semiconductor process and apparatus provide a high performance CMOS devices (108, 109) with hybrid or dual substrates by etching a deposited oxide layer (62) using inverse slope isolation techniques to form tapered isolation regions (76) and expose underlying semiconductor layers (41, 42) in a bulk wafer structure prior to epitaxially growing the first and second substrates (84, 82) having different surface orientations that may be planarized with a single CMP process. By forming first gate electrodes (104) over a first substrate (84) that is formed by epitaxially growing (100) silicon and forming second gate electrodes (103) over a second substrate (82) that is formed by epitaxially growing (110) silicon, a high performance CMOS device is obtained which includes high-k metal PMOS gate electrodes having improved hole mobility.

21 Claims, 3 Drawing Sheets

INVERSE SLOPE ISOLATION AND DUAL SURFACE ORIENTATION INTEGRATION

BACKGROUND OF THE INVENTION

1. Field of the Invention

The present invention is directed in general to the field of semiconductor devices. In one aspect, the present invention relates to field effect transistors (FETs) fabricated on hybrid or dual substrates.

2. Description of the Related Art

To address the difference in electron and hole mobility values for NMOS and PMOS transistor devices formed on semiconductor wafers having a single crystal orientation, CMOS devices are increasingly fabricated with hybrid substrates with different or dual surface orientations (DSO) using semiconductor-on-insulator (SOI) or bulk silicon wafer bonding to provide PMOS and NMOS devices with their own optimized crystal orientation. Prior attempts to integrate dual or hybrid substrates from a bonded SOI wafer have etched through the buried oxide layer to expose an underlying silicon layer which is used to epitaxially grow one of the crystal surface orientations, but have resulted in non-uniform silicon step/recess heights between the different crystal surfaces which require an additional chemical mechanical polish (CMP) step. An example is depicted in FIGS. 1-3 which show a device 10 having two crystal surface orientations—surface 7 having a first orientation and a semiconductor-on-insulator (SOI) layer 3 having a second orientation—separated by buried oxide layers 2 and isolation regions 4 and covered by nitride layers 6. As shown in FIG. 1, an epi silicon layer 7 (having the first orientation) is formed in an opening in the device 10, which itself was formed by etching through the SOI layer 3 and buried oxide layer 2 to expose a portion of the substrate 1. After the epi silicon 8 is polished (as depicted in FIG. 2), the surface of the epi silicon 8 is recessed below the nitride layer 6. However, when the nitride layer 6 is stripped (as depicted in FIG. 3), the epi silicon 8 is higher than the underlying SOI layer 3. To planarize the SOI layer 3 and epi silicon 8 layer, an additional CMP step is required. The collection of etch, epitaxial growth and CMP steps required to obtain uniform surface heights adds significant cost and complexity to the device fabrication. One approach to reduce the different DSO surface heights is to form a bulk wafer by bonding two bulk wafers with no interfacial oxide. However, the silicon-to-silicon bond is a challenging semiconductor process which creates dislocations at the interface which can affect device performance if too close to the active channel regions. These dislocations can be reduced by using high energy implants to amorphize the silicon and then re-crystallizing the silicon with an anneal process, though these additional processing steps also add the cost and complexity of the device fabrication.

Accordingly, a need exists for a cost effective semiconductor manufacturing process which provides the process and performance advantages of forming a bulk hybrid orientation substrate. There is also a need for a fabrication process which avoids the process and performance limitations associated with non-uniform surface heights and minimizes surface step heights in a Dual-Surface Orientation (DSO) integration. In addition, there is a need for improved semiconductor processes and devices to overcome the problems in the art, such as outlined above. Further limitations and disadvantages of conventional processes and technologies will become apparent to one of skill in the art after reviewing the remainder of the present application with reference to the drawings and detailed description which follow.

BRIEF DESCRIPTION OF THE DRAWINGS

The present invention may be understood, and its numerous objects, features and advantages obtained, when the following detailed description is considered in conjunction with the following drawings, in which.

Figure 1:
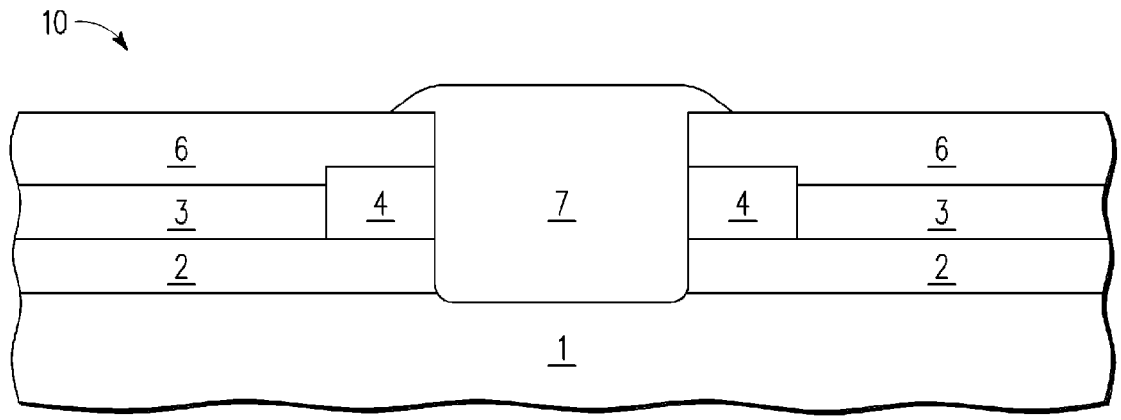
FIG. 1 is a partial cross-sectional view of a conventionally formed dual surface orientation wafer structure after formation of a selective epitaxial semiconductor layer.
Figure 2:
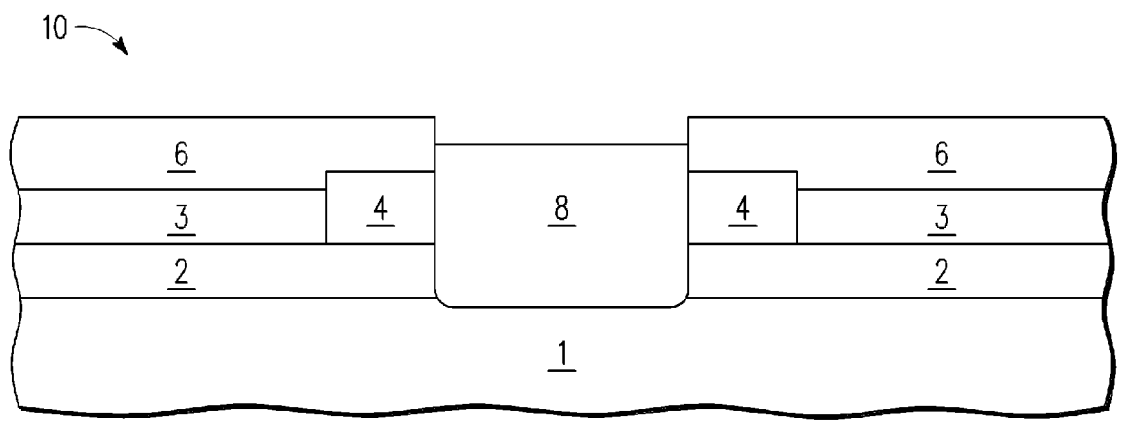
FIG. 2 illustrates processing subsequent to FIG. 1 after polishing of the epi semiconductor layer.
Figure 3:
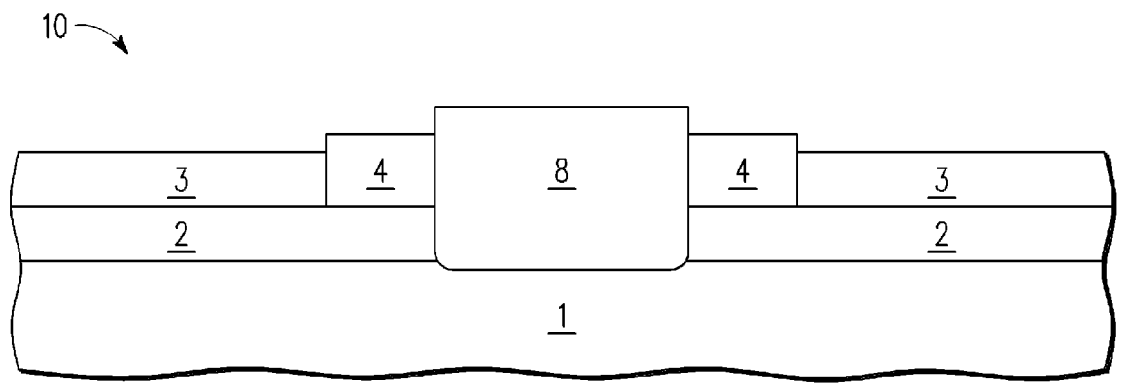
FIG. 3 illustrates processing subsequent to FIG. 2 after a nitride layer is stripped, leaving two surfaces having non-uniform heights.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

DETAILED DESCRIPTION

A method and apparatus are described for fabricating high performance CMOS devices with hybrid or dual substrates by etching a deposited dielectric layer to form tapered isolation regions and expose underlying semiconductor layers in a bulk wafer structure prior to epitaxially growing the first and second substrates having different surface orientations. Using an inverse slope isolation approach to define openings in the deposited dielectric layer that expose the underlying semiconductor layers, dual surface orientation (DSO) substrates can be epitaxially grown at the same time in a cost effective way that results in improved device performance and improved planarity for the first and second substrate heights. By improving the planarization of the dual substrate surfaces, better photolithography control is obtained and dispersion in device parametrics and performance is reduced. In addition, improved planarity in the substrate heights reduces non-uniformity due to variations is structure widths and device densities. Thus, integration of DSO substrates is promoted by using inverse slope isolation to form the n and p active areas simultaneously by growing (110) and (100) epi and then polishing the substrates with a CMP process.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of a semiconductor device without including every device feature or geometry in order to avoid limiting or obscuring the present invention. It is also noted that, throughout this detailed description, certain materials will be formed and removed to fabricate the semiconductor structure. Where the specific procedures for forming or removing such materials are not detailed below, conventional techniques to one skilled in the art for growing, depositing, removing or otherwise forming such layers at appropriate thicknesses may be used. Such details are well known and not considered necessary to teach one skilled in the art of how to make or use the present invention.

Figure 4:
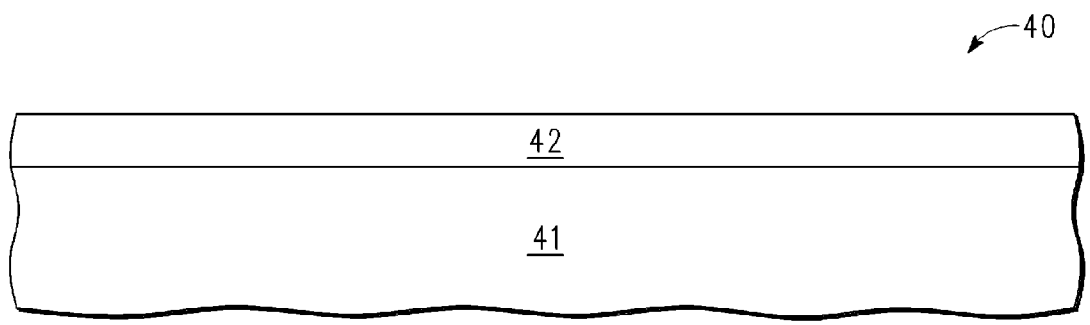
FIG. 4 is a partial cross-sectional view of a semiconductor wafer structure formed by bonding a semiconductor layer to a semiconductor substrate layer.

Turning now to FIG. 4, a partial cross-sectional view is illustrated of a semiconductor wafer structure 40 that is formed by bonding a semiconductor layer 42 to a semiconductor substrate layer 41. Specifically, the structure 40 includes a first semiconductor substrate layer 41 formed of a semiconductor material that has a first crystallographic orientation. Depending on the type of transistor device being fabricated, the first semiconductor layer 41 may be implemented as a bulk silicon substrate, single crystalline silicon (doped or undoped), SOI substrate, or any semiconductor material including, for example, Si, SiC, SiGe, SiGeC, Ge, GaAs, InAs, InP as well as other Group IV and/or III-V and/or II-VI compound semiconductors or any combination thereof, and may optionally be formed as the bulk handling wafer. The crystallographic orientation of the first semiconductor layer 41 may be (100), though it will be appreciated that other crystallographic orientations can be used, such as (110) or (111).

The semiconductor wafer structure 40 also includes a second semiconductor layer 42 having a predetermined thickness and formed of a semiconductor material which has a second crystallographic orientation which is different from the first crystallographic orientation. To provide material for subsequently growing epitaxial silicon, the second semiconductor layer 42 is formed as a relatively thin layer having a predetermined minimum thickness (e.g., approximately between 50-1000 Angstroms thick), though other minimum thicknesses may be used. Depending on the type of transistor device being fabricated, the second semiconductor layer 42 may be formed from any semiconductor material, including, for example, Si, SiC, SiGe, SiGeC, Ge, GaAs, InAs, InP as well as other group IV or III-V or II-VI compound semiconductors or any combination thereof. In selected embodiments, the crystallographic orientation of the second semiconductor layer 42 may be (110) or (100), though other crystallographic orientations can be used. The crystal orientations of the first semiconductor layer 41 and the second semiconductor layer 42 will depend on the materials used to form the wafer structure 40. For example, when silicon is employed as the semiconductor material, electron mobility is higher on a (100) surface orientation, and hole mobility is higher on a (110) surface orientation. In this case, the (100) silicon surface is used as the substrate layer 41 for NMOS devices, while the (110) silicon surface is used as the substrate layer 42 for PMOS devices. As depicted in FIG. 4, the first semiconductor substrate layer 41 and second semiconductor layer 42 are bonded together to form a resultant bulk wafer structure 40. In an example implementation, the second semiconductor layer 42 is a donor wafer structure that bonded to the first semiconductor substrate layer 41 which acts as a handle wafer structure. In selected embodiments, the donor wafer structure 42 is bonded to the handle wafer structure 41 using any desired bonding technique, such as by performing electrostatic bonding, followed by thermal bonding or pressure bonding.

Figure 5:
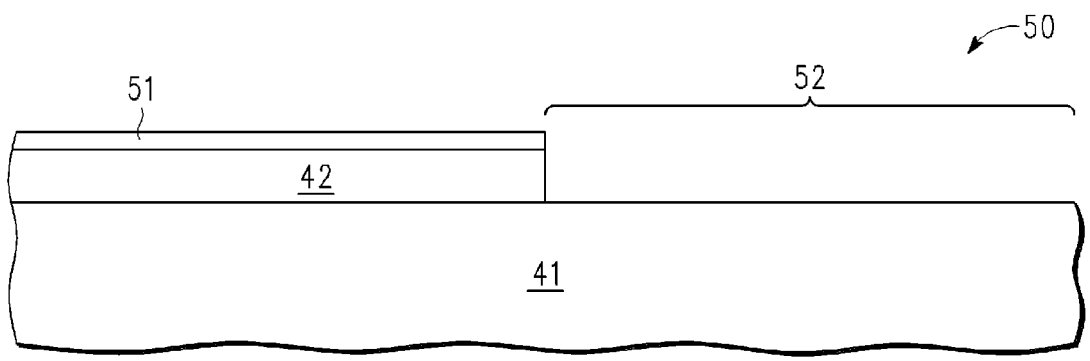
FIG. 5 illustrates processing subsequent to FIG. 4 where a first mask layer is formed over the semiconductor wafer structure for use in selectively removing portions of the semiconductor layer to expose the underlying semiconductor substrate layer.

FIG. 5 illustrates processing of the semiconductor wafer structure 50 subsequent to FIG. 4 where a first mask layer 51 is formed over part of the second semiconductor layer 42 for use in selectively removing portions of the second semiconductor layer 42 to expose portions of the underlying first semiconductor substrate layer 41 in a first predetermined area. In selected embodiments, the first mask layer 51 is formed as a well implant mask over part of the second semiconductor layer 42 in a second predetermined area using any desired technique, such as, for example, a photoresist layer a nitride layer, a hardmask layer, etc. With the first mask layer 51 in place, the exposed portion of the semiconductor layer 42 is selectively removed using any desired patterning and anisotropic etching techniques, including a dry etching process such as reactive-ion etching, ion beam etching, plasma etching or laser etching, a wet etching process wherein a chemical etchant is employed or any combination thereof. When the exposed portion of the second semiconductor layer 42 is removed, an opening 52 is formed to expose a portion of the first semiconductor substrate layer 41.

At this stage of manufacture, well-regions (not shown) may be formed in the exposed portions of the first semiconductor substrate layer 41 by selectively implanting dopants using the first mask layer 51 as an implant mask. For example, well regions may be formed by implanting impurities (e.g., arsenic or phosphorous or boron) with an implant energy of approximately 10-1000 keV and a dosage of approximately $1 \times 10^{11}$ to $1 \times 10^{14}$ cm$^{-2}$, though other implant species, energies, and dosages may be used.

Figure 6:
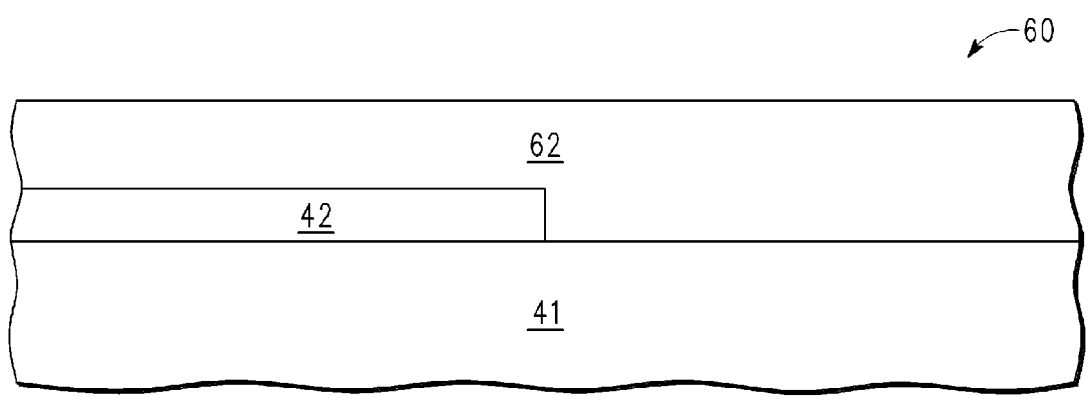
FIG. 6 illustrates processing subsequent to FIG. 5 after the first mask layer is removed and a deposited dielectric layer is formed over the semiconductor wafer structure.
Figure 9:
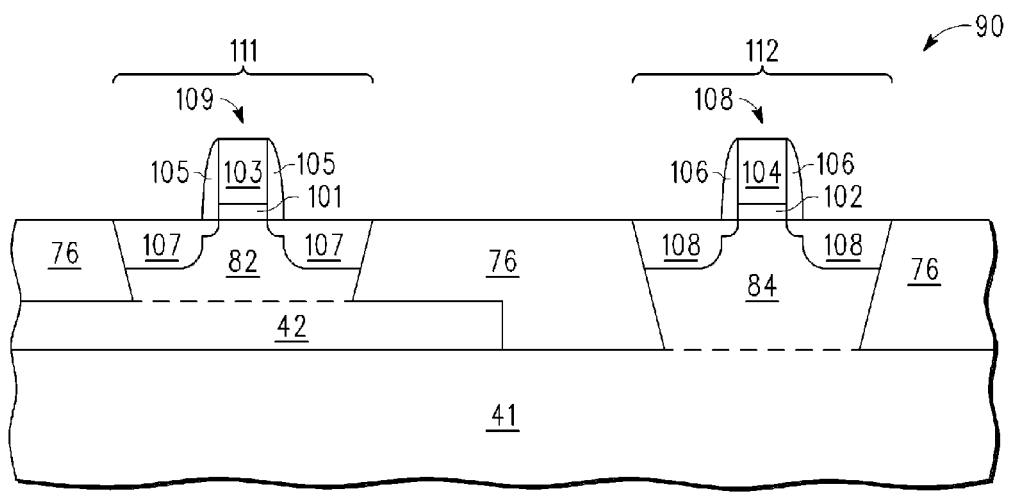
FIG. 9 illustrates processing subsequent to FIG. 8 after first and second semiconductor devices are formed.

FIG. 6 illustrates processing of the semiconductor wafer structure 60 subsequent to FIG. 5 after the first mask layer 51 is removed and a deposited dielectric layer 62 is formed over the semiconductor wafer structure 60. While the dielectric layer 62 can be formed from one or more deposited dielectric layers with any desired dielectric materials, a high density plasma oxide is deposited in accordance with a selected embodiment. In addition, the dielectric layer 62 may be deposited to a predetermined minimum thickness, such as approximately 2000-6000 Angstroms, though other thicknesses can be used. The thickness of the dielectric layer 62 should be sufficient to provide a substantially planar dielectric layer 62 that completely covers both the exposed first semiconductor substrate layer 41 and the remaining (unetched) second semiconductor layer 42, and to provide for electrical isolation of devices formed later as shown in FIG. 9. If the semiconductor wafer structure 60 is not substantially planar after the dielectric layer 62 is formed, a CMP process may be applied to polish the dielectric layer 62 and the CMP etch stop layer can be deposited on top the dielectric layer 62. Though not shown, an etch stop layer may be formed over the semiconductor wafer structure 60 prior to depositing the dielectric layer 62. In addition, the dielectric layer 62 may be formed in whole or in part by thermally growing silicon oxide over the semiconductor wafer structure 60.

Figure 7:
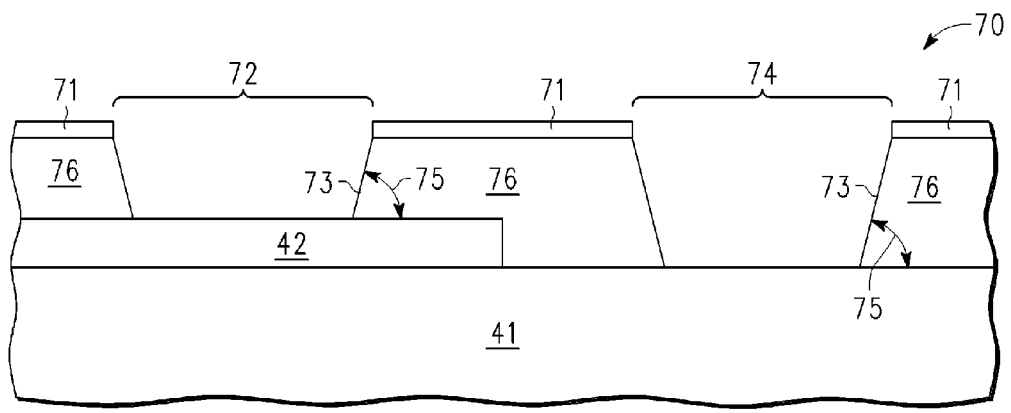
FIG. 7 illustrates processing subsequent to FIG. 6 after a patterned mask layer is formed over the deposited dielectric layer and an active etch process is used to selectively remove portions of the deposited dielectric layer to thereby form one or more openings to the semiconductor layer and underlying semiconductor substrate layer.

FIG. 7 illustrates processing of the semiconductor wafer structure 70 subsequent to FIG. 6 after a patterned mask layer 71 is formed over the deposited dielectric layer 62 and an active etch process is used to selectively remove portions of the deposited dielectric layer 62 to thereby form one or more openings 72, 74 to the underlying first semiconductor substrate layer 41 and second semiconductor layer 42. In particular, an active etch process uses the patterned mask layer 71 to selectively remove the unprotected portions of the oxide layer 62 so that the etch process stops at the underlying semiconductor layers 41, 42, thereby exposing the first semiconductor substrate layer 41 and second semiconductor layer 42 at the bottom of the trench openings 74, 72. In selected embodiments, the deposited dielectric layer 62 is etched to form isolation regions 76 having top portions that are narrower than their bottom portions, thereby a tapered isolation region is formed. In an example embodiment, the etch profile is tapered from the junction of the patterned mask layer 71 and dielectric layer 76 down to the surface of the underlying semiconductor layers 41, 42. This etch profile includes the sidewalls 73. The angle 75, which is the angle between the surface of the underlying semiconductor layer 41, 42 and the side wall 73, is less than 90 degrees, and will generally be approximately 80-60 degrees. In order to obtain the tapered etch profile 73, an etch process using a carbon and fluorine containing gas along with oxygen can be used. The introduction of oxygen with the carbon and fluorine containing gas results in a resist erosion, which facilitates the formation of the tapered, etch profile of walls 73. Specific examples of carbon and fluorine containing gases capable of being used include $CHF_3$, $CF_4$, $C_2 F_6$, $C_3 F_8$, and $C_4 F_8$. In a specific implementation, Applied Materials Centura 5200 M×P+dielectric etch chamber is used to form the trenches with a process condition of 1100 W, 200 mtorr, 30 gauss, 50 sccm $CHF_3$, 10 sccm $O_2$, 50 sccm Ar. As will be appreciated, other selective etch processes may be used, including a dry etching process such as reactive-ion etching, ion beam etching, plasma etching or laser etching, a wet etching process wherein a chemical etchant is employed or any combination thereof. In addition, if the dielectric layer 62 is formed as a composite of different material layers, the angle of the tapered sidewall may be different from each constituent layer, depending on the materials and etch processes used.

As illustrated, the portions of the first semiconductor substrate layer 41 that are exposed by the opening 74 (and subsequently epitaxially regrown, as described hereinbelow) define a first device region for a first type of MOS device (e.g., PMOS devices). Similarly, the portions of the second semiconductor substrate layer 42 that are exposed by the opening 72 (and subsequently epitaxially regrown, as described hereinbelow) define a second device region for a second type of MOS device (e.g., NMOS devices). To this end, the unetched portions of the dielectric layer 62 may be used to form at least part of the shallow trench isolation regions for electrically and physically isolating the first and second device regions from one another by designing the width and placement of the etch openings 72, 74 to be spaced apart by a minimum spacing distance.

Figure 8:
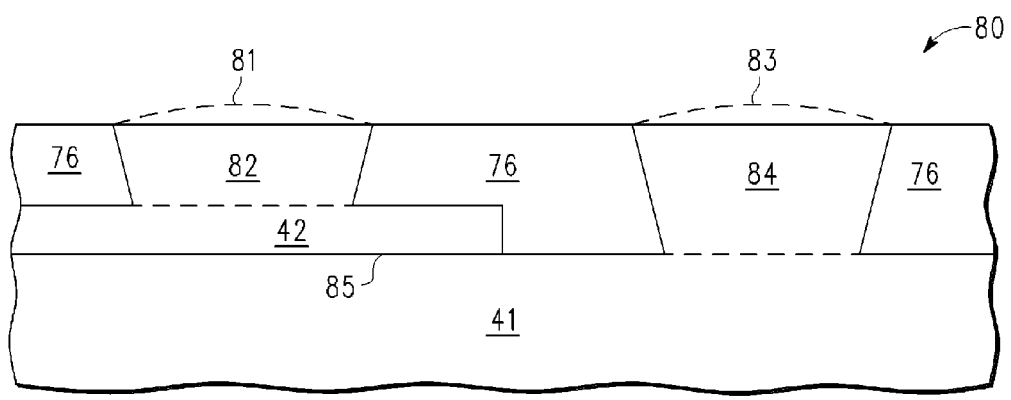
FIG. 8 illustrates processing subsequent to FIG. 7 after epitaxial semiconductor layers are selectively grown and then planarized to partially or completely fill the openings.

FIG. 8 illustrates processing of the semiconductor wafer structure 80 subsequent to FIG. 7 after epitaxial semiconductor layers 82, 84 are selectively grown and then planarized to partially or completely fill the openings 72, 74. As described herein and understood by those skilled in the art, the process of forming an epitaxial layer may be described as either depositing or growing a layer so that the "growth" and "deposition" terms are used interchangeably in this respect, though growth is a more descriptive term for epitaxy. Since the first epitaxial semiconductor layer 84 is epitaxially grown from the first semiconductor substrate layer 41, they will have the same crystallographic orientations, though the layers 41, 84 can be formed of different semiconductor materials. Likewise, by epitaxially growing the second epitaxial semiconductor layer 82 from the second semiconductor layer 42, they will have the same crystallographic orientations, even if they are formed of different semiconductor materials. By selectively growing the epitaxial semiconductor layers 82, 84 from underlying semiconductor layers that have different crystallographic orientations, the crystallographic orientation of the epitaxial semiconductor layers 82, 84 are different from one another. With different surface orientations, the mobility of the holes and electrons for subsequently formed PMOS and NMOS devices, respectively, may be optimized.

In an example implementation where NMOS devices are to be formed over the first epitaxial semiconductor layer 84, the first epitaxial semiconductor layer 84 may be formed by epitaxially growing silicon having a crystallographic orientation (e.g., (100)) that is the same as the crystallographic orientation of the first semiconductor substrate layer 41. This epitaxial growth may be achieved by heating the semiconductor wafer structure 80 at a temperature between 500 and 900° C. in the presence of dichlorosilane, HCl and hydrogen gas. Selectivity of the epitaxial growth process is attained by maintaining an HCl to dicholorosilane ratio such that the epitaxial growth occurs only on exposed silicon regions 41 and 42, and no growth occurs on oxide region 76. Prior to the epitaxial growth of layers 82 and 84, the surface may be prepared to maximize epitaxial growth quality by wet clean and in-situ hydrogen bake. At the same time, the epitaxial growth process causes the second semiconductor layer 82 to be formed by epitaxially growing silicon having a (110) crystallographic orientation that is the same as the crystallographic orientation of the second semiconductor layer 42. In this case, NMOS devices would be formed on the first epitaxial semiconductor layer 84 which has a (100) crystallographic orientation, while PMOS devices would be formed on the second epitaxial semiconductor layer 82 which has a (110) crystallographic orientation. By optimizing the crystallographic orientations of the layers 41, 42 (e.g., so that the first epitaxially grown layer 84, or "epi-layer," is formed of (100) semiconductor material and the second epi layer 82 is formed of (110) semiconductor material), significant mobility improvements are obtained over single-orientation substrates—up to 2.5× improvement for hole mobility in PMOS devices in (110) surface orientation silicon over those in (100) surface orientation silicon.

In addition to providing hybrid substrates with optimized crystallographic orientations, the simultaneous growth of the first and second epi layers 84, 82 results in the formation of substrate structures that are less sensitive to the interface 85 between the bonded semiconductor layers 41, 42. The reduced sensitivity results from the fact that the channel regions in the subsequently formed transistor devices are physically remote from the bonding interface 85. And by growing the first and second epi layers 84, 82 in the tapered trench openings 74, 72, the finally formed wafer structure will have larger active areas on a smaller die size by virtue of the trenches 72, 74 being wider at the top and narrower at the bottom.

By overfilling the trench openings 72, 74 with the epitaxial semiconductor layers 82, 84 (as indicated by dashed upper surface lines 81, 83), crystalline defectivity within the trench openings 72, 74 is reduced or minimized. If the patterned mask layer 71 is still in place when the epitaxial growth process occurs, then the trench openings 72, 74 can be overfilled by growing the epi layers 82, 84 above and over the patterned mask layer 71. Otherwise, the overflow is achieved by growing the epi layers 82, 84 above and over the top of the isolation regions 76. In any event, the epi layers 82, 84 may be simultaneously planarized to remove any overflow material by polishing the semiconductor wafer structure 80 with a chemical mechanical polishing (CMP) step and/or any desired etchant or stripping process. Deposition rates of selective epitaxial growth, as described herein and understood by those skilled in the art, is dependent upon crystal orientation. In this example implementation, the (110) epitaxial growth rate will be lower than the growth rate of (100) silicon. To reduce the subsequent chemical mechanical polishing (CMP) complexity and increase the post-CMP planarity, the thickness of layer 42 may be chosen such that the post epitaxial overfill of 72 and 74 with semiconductor layers 82 and 84 are substantially similar. As a result, a dual substrate structure having a substantially coplanar surface is obtained by polishing and/or etching the epi layers 82, 84 back to the same level as the isolation regions 76. Of course, the epi layers 82, 84 may be polished or etched back to a lesser or greater extent, but in any case is substantially coplanar with the isolation regions 76 to facilitate CMOS processing.

As described herein, the first and second epitaxial semiconductor layers 84, 82 may be formed by selectively growing epitaxial silicon so that the epi-silicon layers 84, 82 are formed at the same time. However, depending on the type of transistor devices being fabricated, either or both of the epitaxial semiconductor layers 82, 84 may be formed from any semiconductor material, such as Si, SiGe, SiC, SiGeC or combinations thereof, which is capable of being formed utilizing a selective epitaxial growth method. Selected embodiments of the present invention also contemplate using strained or compressed materials to further enhance mobility.

FIG. 9 illustrates processing of the semiconductor wafer structure 90 subsequent to FIG. 8 after first and second semiconductor devices 108, 109 are formed. While other device structures may be used in connection with the planarized dual substrate wafer described herein, the example of FIG. 9 depicts transistor device structures formed from a gate dielectric material (such as silicon dioxide) and gate structures (such as polysilicon gates). In the implementation depicted in FIG. 9, PMOS and NMOS devices may be formed on the exposed semiconductor layers (i.e., the first and second epi layers 82, 84), which may include well and body regions (not shown) in each epi layer 82, 84, respectively. Specifically, a first semiconductor device 108 is an NMOS device formed on a portion of the first epitaxial semiconductor layer 84, and a second semiconductor device 109 is a PMOS device formed on a portion of the second epitaxial semiconductor layer 84. Alternatively, the first semiconductor device 108 may be a PMOS device and the second semiconductor device 109 may be an NMOS device. The allocation of device types to device regions may exploit the differing crystal orientation of the underlying layers 82, 84 to provide a high performance CMOS device where the PMOS device has improved hole mobility. This may be accomplished, for example, by forming the PMOS devices over the semiconductor material that has a (110) or (100) orientation, whereas the NMOS devices are formed over a semiconductor surface having a (100) or (110) orientation. In addition, the hole mobility of the PMOS devices may be further improved by forming the PMOS gate dielectrics and electrodes over a layer of compressed silicon germanium having a (110) orientation. The electron mobility of the NMOS devices may be further improved by forming the NMOS gate dielectrics and electrodes over a layer of tensile silicon having a (100) orientation.

In the example depicted in FIG. 9, the depicted wafer structure 90 includes a first epitaxial semiconductor layer 84—in which may be formed a body region (not shown)—and a second epitaxial layer 82—in which may be formed a well region (not shown)—that are laterally displaced and isolated with respect to one another by shallow trench isolation regions 76. The body and well regions contain impurities such that one is a p-doped and one is an n-doped. In the described embodiment, the body in the first epi layer 84 is a p-doped in which NMOS transistors are formed, and the well in the second epi layer 82 is an n-doped in which PMOS transistors are formed.

Following the formation of wells and isolation trenches, at least a first gate dielectric layer is blanket deposited and/or grown across the entire wafer structure 90 and used to subsequently form the gate dielectric layers 101, 102. The first gate dielectric layer may be used to form at least part of the gate dielectric for all transistors on the wafer, or alternatively, the first gate dielectric layer may be used for only a first type of transistor formed on the wafer. In the depicted embodiment, the first gate dielectric layer may formed from a dielectric (e.g., silicon dioxide, a metal oxide or some other high-k dielectric material) that is formed by oxidation, chemical vapor deposition, or by atomic layer deposition having a typical final thickness that is in the range of 0.1-10 nanometers.

After forming the first gate dielectric layer, one or more first gate electrodes 103, 104 are formed on the first gate dielectric layer above first and second epi layers 84, 82 using any desired gate electrode formation sequence. For example, the gate electrodes 103, 104 may be formed from at least a first conductive layer (e.g., polysilicon, SiGe and/or metal) by depositing or forming a first conductive layer having a thickness in the range of 1-200 nanometers over the gate dielectric layer to form a first gate stack. Once the first gate stack is formed, any desired gate electrode etch processing steps may be used to form the desired gate electrode 103, 104 over the first gate dielectric layer.

With the etched gate electrodes 103, 104 in place, one or more sidewall spacers 105, 106 may be formed on the sides of the gate electrodes 103, 104 by growing and/or depositing a spacer layer over the wafer structure 90 and then anisotropically etching the spacer layer (and any exposed first gate dielectric layer) down to the respective epi substrates formed by the first and second epi layers 84, 82. With the spacers in place, source/drain regions may be formed in the epi substrates 84, 82 using any desired implantation sequence. For example, the gate electrodes 104 in the first active device region 112 may be masked so that the source/drain regions 107 in the second active device region 111 may be formed by implanting dopants into the exposed regions of the epi substrate 82. As will be appreciated, the dopants may be implanted into source/drain regions 107 around the gate electrode 103 prior to forming sidewall spacers 105 and/or after forming sidewall spacers 105. In similar fashion, the gate electrodes 103 in the second active device region 111 may be masked so that the source/drain regions 108 in the first active device region 112 may be formed by implanting dopants into the exposed regions of the epi substrate 84, again by implanting dopants around the gate electrodes 104 and/or by first forming sidewall spacers 106 on the sides of the gate electrodes 104 and then implanting the source/drain regions 108.

It will be appreciated that additional processing steps will be used to complete the fabrication of first and second transistor device structures into transistors. As examples, one or more sacrificial oxide formation, stripping, isolation region formation, well region formation, extension implant, halo implant, spacer formation, source/drain implant, heat drive or anneal steps, and polishing steps may be performed, along with conventional backend processing (not depicted), typically including formation of multiple levels of interconnect that are used to connect the transistors in a desired manner to achieve the desired functionality. Thus, the specific sequence of steps used to complete the fabrication of the semiconductor structures may vary, depending on the process and/or design requirements.

In one form, there is provided herein a method for fabricating a dual substrate semiconductor structure. In the method, a first semiconductor layer having a first crystal orientation (e.g., (100) p-type silicon) is bonded to a second semiconductor layer having a second crystal orientation (e.g., (110) n-type silicon) that is different from the first crystal orientation. After the first and second semiconductor layers are bonded, a portion of the second semiconductor layer is selectively removed to expose the first semiconductor layer in a first predetermined region and to leave a remaining portion of the second semiconductor layer in a second predetermined region. In an example embodiment, this is accomplished by forming a first mask layer over the second semiconductor layer having an opening over the first predetermined region, then using the first mask layer to etch the second semiconductor layer to expose the first semiconductor layer in the first predetermined region. A substantially planar dielectric layer (e.g., a deposited oxide layer) having an upper surface and a bottom surface is subsequently formed to completely cover the exposed first semiconductor layer and the remaining portion of the second semiconductor layer. To planarize the dielectric layer, a chemical mechanical polish step may be performed. In the dielectric layer, first and second trench openings are formed so that the first trench opening exposes a portion of the first semiconductor layer in the first predetermined region and the second trench opening exposes a portion of the second semiconductor layer in the second predetermined region. Each trench opening is formed with a first dimension at the upper surface and a second dimension at the bottom surface that is smaller than the first dimension. All or part of the first and second trench openings are then filled by epitaxially growing semiconductor material from the exposed portion of the first semiconductor layer and the exposed portion of the second semiconductor layer so that the first trench opening is filled at least in part with a first epi layer that has a third crystal orientation that is the same as the first crystal orientation and so that the second trench opening is filled at least in part with a second epi layer that has a fourth crystal orientation that is the same as the second crystal orientation. In an example implementation, the trench openings are filled by selectively growing an epitaxial silicon layer so that the first trench opening is filled at least in part with a first epi silicon layer and so that the second trench opening is filled at least in part with a second epi silicon layer. To make the first epi layer substantially coplanar with the second epi layer and the wafer surface, a chemical mechanical polish step may be applied. In the resulting structure, the first epi layer is electrically isolated from the second epi layer by a shallow trench isolation region formed from the dielectric layer located between the first epi layer and the second epi layer. On the wafer structure, first gate electrode structures may be formed over the first epi layer, and second gate electrode structures may be formed over the second epi layer.

In another form, there is provided method for forming a semiconductor structure having dual substrates on a wafer. In the method, a first semiconductor layer having a first crystal orientation (e.g., (100) p-type silicon) is formed and bonded to a second semiconductor layer having a crystal orientation (e.g., (110) n-type silicon) that is different from the first crystal orientation of the first semiconductor layer. With the first and second semiconductor layer bonded, a first opening in the second semiconductor layer is formed to expose a first region of the first semiconductor layer by removing a portion of the second semiconductor layer. This may be done by forming a first mask layer over the second semiconductor layer having an opening over the first region, and then using the first mask layer to etch the second semiconductor layer to expose the first semiconductor layer in the first region. Subsequently, a substantially planar insulator layer having an upper and lower surface is formed over the first and second semiconductor layers (e.g., by depositing and CMP planarizing an oxide layer to completely cover the first and second semiconductor layers), and first and second trench openings are formed in the substantially planar insulator layer. The trenches may be formed by selectively etching the substantially planar insulator layer to leave an electrical isolation region for isolating the first epi layer from the second epi layer. As formed, the first trench opening exposes a portion of the first semiconductor layer and the second trench opening exposes a portion of the second semiconductor layer, and the first and second trench openings each have a first dimension at the upper surface and a second dimension at the bottom surface that is smaller than the first dimension. At least part of the first and second trench openings are then filled by epitaxially growing semiconductor material from the exposed portion of the first semiconductor layer and the exposed portion of the second semiconductor layer so that the first trench opening is filled at least in part with a first epi layer and so that the second trench opening is filled at least in part with a second epi layer. In selected embodiments, the epi layers are formed by selectively growing epitaxial silicon layer so that the first trench opening is filled at least in part with a first epi silicon layer and so that the second trench opening is filled at least in part with a second epi silicon layer. The resulting first and second epi layers are planarized (e.g., with a chemical mechanical polish step) so that the first epi layer is substantially coplanar with the second epi layer.

In yet another form, there is provided a method for fabricating FET devices on dual substrates. First, a second semiconductor layer is bonded to an underlying first semiconductor layer, where the second semiconductor layer has a different crystallographic orientation (e.g., (110) n-type silicon) from the underlying first semiconductor layer (e.g., (100) p-type silicon). Subsequently, the first semiconductor layer is exposed in a first area (such as by using a selective etch process) and a dielectric layer is formed over the first and second semiconductor layers. By applying an active etch process, portions of the dielectric layer are selectively removed to form first and second tapered trench openings in the dielectric layer. As formed, the first tapered trench opening exposes a portion of the first semiconductor layer in a first predetermined region and the second tapered trench opening exposes a portion of the second semiconductor layer in a second predetermined region. In these tapered trench openings, an epitaxial semiconductor material is selectively grown to fill at least part of the first and second tapered trench openings so that the first tapered trench opening is filled at least in part with a first epi layer and so that the second tapered trench opening is filled at least in part with a second epi layer, where the first and second epi layers have different crystallographic orientations. The first and second epi layers are subsequently polished, thereby providing substantially coplanar first and second epi layers on which FET devices may be formed. As will be appreciated, the FET devices may be fabricated at least in part by forming at least a first insulator layer over the first and second epi layers, forming at least a first conductive gate layer over the first insulator layer, and selectively etching the first conductive gate layer to form FET gate electrodes.

Although the described exemplary embodiments disclosed herein are directed to various semiconductor device structures and methods for making same, the present invention is not necessarily limited to the example embodiments which illustrate inventive aspects of the present invention that are applicable to a wide variety of semiconductor processes and/or devices. Thus, the particular embodiments disclosed above are illustrative only and should not be taken as limitations upon the present invention, as the invention may be modified and practiced in different but equivalent manners apparent to those skilled in the art having the benefit of the teachings herein. For example, an alternative to the device structure shown in FIG. 9 is for first well (not shown) in the layer 84 to be an n-doped well and the second well (not shown) in the layer 82 to be p-doped. Also, the gate dielectric layers (101, 102) and the gate electrodes layers (103, 104) may be different materials than those disclosed. Moreover, the thickness of the described layers may deviate from the disclosed thickness values. In addition, the techniques disclosed herein may be used not only with DSO bulk devices, but also with SOI substrates having thin buried oxide layers. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. For example, the disclosed semiconductor manufacturing processes provide for a cost effective integration of a bulk hybrid orientation substrate while reducing or eliminating the process and performance limitations associated with conventional DSO manufacturing approaches. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for fabricating a semiconductor structure, comprising:
    bonding a first semiconductor layer having a first crystal orientation directly to a second semiconductor layer having a second crystal orientation that is different from the first crystal orientation;
    selectively removing a portion of the second semiconductor layer to expose the first semiconductor layer in a first predetermined region and to leave a remaining portion of the second semiconductor layer in a second predetermined region;
    forming a dielectric layer to completely cover the exposed first semiconductor layer and the remaining portion of the second semiconductor layer with a dielectric layer, where the dielectric layer has an upper surface and a bottom surface;
    forming first and second trench openings in the dielectric layer, wherein the first trench opening exposes a portion of the first semiconductor layer in the first predetermined region and the second trench opening exposes a portion of the second semiconductor layer in the second predetermined region, and wherein the first and second trench openings each have a first dimension at the upper surface and a second dimension at the bottom surface that is smaller than the first dimension; and
    filling at least part of the first and second trench openings by epitaxially growing semiconductor material from the exposed portion of the first semiconductor layer and the exposed portion of the second semiconductor layer so that the first trench opening is filled at least in part with a first epi layer that has a third crystal orientation that is the same as the first crystal orientation and so that the second trench opening is filled at least in part with a second epi layer that has a fourth crystal orientation that is the same as the second crystal orientation.

2. The method of claim 1, further comprising performing a chemical mechanical polish step so that the first epi layer is substantially coplanar with the second epi layer.

3. The method of claim 1, where selectively removing a portion of the second semiconductor layer comprises:
    forming a first mask layer over the second semiconductor layer having an opening over the first predetermined region; and
    using the first mask layer to etch the second semiconductor layer to expose the first semiconductor layer in the first predetermined region.

4. The method of claim 1, where forming a dielectric layer comprises depositing an oxide layer to completely cover the exposed first semiconductor layer and the remaining portion of the second semiconductor layer.

5. The method of claim 4, further comprising performing a chemical mechanical polish step to planarize the deposited oxide layer.

6. The method of claim 1, wherein the first semiconductor layer comprises (100) p-type silicon and the second semiconductor layer comprises (110) n-type silicon.

7. The method of claim 1, where the first epi layer is electrically isolated from the second epi layer by a shallow trench isolation region formed from the dielectric layer located between the first epi layer and the second epi layer.

8. The method of claim 1, further comprising:
    forming a first gate electrode structure over the first epi layer; and
    forming a second gate electrode structure over the second epi layer.

9. The method of claim 1, where filling at least part of the first and second trench openings comprises selectively growing epitaxial silicon layer so that the first trench opening is filled at least in part with a first epi silicon layer and so that the second trench opening is filled at least in part with a second epi silicon layer.

10. A method for forming a semiconductor structure on a wafer, comprising:
    bonding a second semiconductor layer directly to at least part of a first semiconductor layer, where the second semiconductor layer has a crystal orientation that is different from the first crystal orientation of the first semiconductor layer;

forming a first opening to expose a first region of the first semiconductor layer by removing a portion of the second semiconductor layer;

forming a substantially planar insulator layer over the first and second semiconductor layers, where the substantially planar insulator layer has an upper surface and a bottom surface;

forming first and second trench openings in the substantially planar insulator layer, wherein the first trench opening exposes a portion of the first semiconductor layer and the second trench opening exposes a portion of the second semiconductor layer, and wherein the first and second trench openings each have a first dimension at the upper surface and a second dimension at the bottom surface that is smaller than the first dimension;

filling at least part of the first and second trench openings by epitaxially growing semiconductor material from the exposed portion of the first semiconductor layer and the exposed portion of the second semiconductor layer so that the first trench opening is filled at least in part with a first epi layer and so that the second trench opening is filled at least in part with a second epi layer; and planarizing the first and second epi layers so that the first epi layer is substantially coplanar with the second epi layer.

11. The method of claim 10, where planarizing the first and second epi layers comprises performing a chemical mechanical polish step.

12. The method of claim 10, wherein the first semiconductor layer comprises (100) p-type silicon and the second semiconductor layer comprises (110) n-type silicon.

13. The method of claim 10, where forming a first opening comprises:

forming a first mask layer over the second semiconductor layer having an opening over the first region; and using the first mask layer to etch the second semiconductor layer to expose the first semiconductor layer in the first region.

14. The method of claim 10, where forming a substantially planar insulator layer comprises depositing an oxide layer to completely cover the exposed first semiconductor layer and the remaining portion of the second semiconductor layer.

15. The method of claim 14, comprising performing a chemical mechanical polish step to planarize the deposited oxide layer.

16. The method of claim 10, where forming first and second trench openings comprises selectively etching the substantially planar insulator layer to leave an electrical isolation region for isolating the first epi layer from the second epi layer.

17. The method of claim 10, where filling at least part of the first and second trench openings comprises selectively growing epitaxial silicon layer so that the first trench opening is filled at least in part with a first epi silicon layer and so that the second trench opening is filled at least in part with a second epi silicon layer.

18. A method for fabricating FET devices on dual substrates, comprising:

providing a second semiconductor layer that is directly bonded to an underlying first semiconductor layer, where the second semiconductor layer has a different crystallographic orientation from the underlying first semiconductor layer;

exposing the first semiconductor layer in a first area;

forming a dielectric layer over the first and second semiconductor layers;

applying an active etch process to selectively remove the dielectric layer to form first and second tapered trench openings in the dielectric layer, wherein the first tapered trench opening exposes a portion of the first semiconductor layer in a first predetermined region and the second tapered trench opening exposes a portion of the second semiconductor layer in a second predetermined region;

selectively growing an epitaxial semiconductor material to fill at least part of the first and second tapered trench openings so that the first tapered trench opening is filled at least in part with a first epi layer and so that the second tapered trench opening is filled at least in part with a second epi layer, where the first and second epi layers have different crystallographic orientations;

polishing the first and second epi layers so that the first epi layer is substantially coplanar with the second epi layer; and forming FET devices over the polished first and second epi layers.

19. The method of claim 18, where forming FET devices comprises:

forming at least a first insulator layer over the first and second epi layers;

forming at least a first conductive gate layer over the first insulator layer; and selectively etching the first conductive gate layer to form FET gate electrodes.

20. The method of claim 18, wherein the first semiconductor layer comprises (100) p-type silicon and the second semiconductor layer comprises (110) n-type silicon.

21. The method of claim 18, further comprising preparing the exposed portion of the first semiconductor layer and the exposed portion of the second semiconductor layer by applying a wet clean process and an in-situ hydrogen bake process prior to selectively growing the epitaxial semiconductor material.

* * * * *